Dec. 11, 1962 D. W. ROBERTSON ETAL 3,068,426
CRYSTAL OSCILLATOR UTILIZING CRYSTAL HOLDER
CAPACITY AT VERY HIGH FREQUENCIES
Filed June 19, 1958
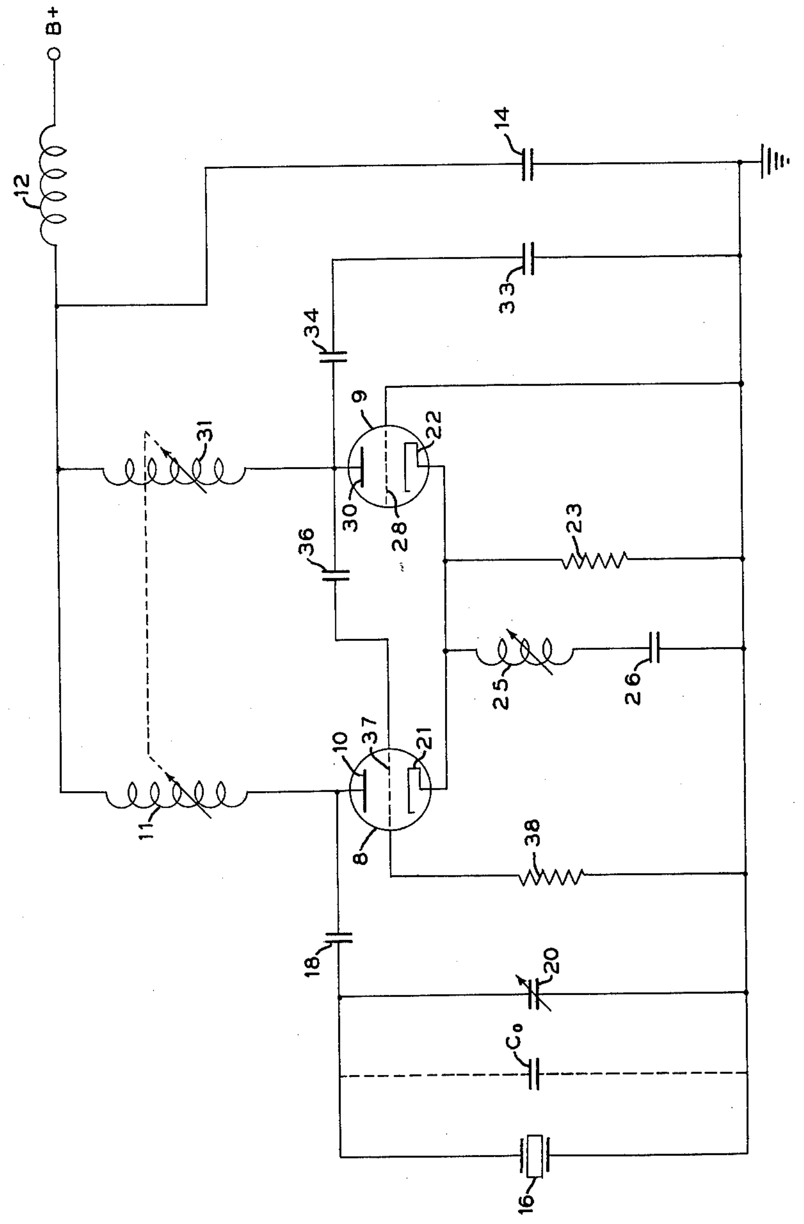
INVENTORS:
DOUGLAS W. ROBERTSON
WALTER B. WARREN, JR.
BY: [signature]
ATTORNEY 3,068,426

CRYSTAL OSCILLATOR UTILIZING CRYSTAL HOLDER CAPACITY AT VERY HIGH FREQUENCIES

Douglas W. Robertson and Walter B. Warren, Jr., Decatur, Ga., assignors to The Georgia Tech Research Institute, Atlanta, Ga., a corporation of Georgia
Filed June 19, 1958, Ser. No. 743,157
7 Claims. (Cl. 331—159)

This invention relates to an oscillator, and more particularly concerns an oscillator which, in conjunction with conventional high-frequency piezoelectric quartz crystals, is capable of generating a sustained very-high-frequency electronic signal that is directly controlled by one of the crystal overtone responses.

Existing techniques for obtaining stable oscillations permit precise control of frequencies below 100 megacycles by means of piezoelectric quartz crystals. In the range of 300 to 1200 megacycles, special high Q coaxial cavities have been utilized; and other techniques have been used to produce accurate frequency control in the microwave region. Stable signals in the 100 to 300 megacycle frequency range, however, are usually obtained indirectly through the use of an electronic multiplication process in which a signal from a low frequency crystal is multiplied until the desired frequency is obtained. Such method, however, requires a large number of vacuum tubes which, with the complexity of necessary associated circuitry, makes the system both cumbersome and unreliable. In addition, such multiplication processes often generate large numbers of spurious signals.

Direct crystal control of oscillators operating at frequencies up to 275 megacycles have been reported; however, these configurations usually require special crystal units or modifications of conventional crystal units to overcome the frequency limiting shunt capacity which is inherent in conventional crystals, being formed across the quartz material by the holder electrodes. The reactance of this shunt capacity becomes small at frequencies about 100 megacycles so as to effect an electrical path paralleling that of the quartz plate whereby the crystal is prevented from maintaining frequency control of its associated oscillator.

One of the objects of this invention, therefore, is to provide a new and improved oscillator which is capable of utilizing conventional high-frequency quartz crystals to obtain direct frequency control in the very-high-frequency range of approximately 100 to 300 megacycles.

Another object of this invention is to provide a new and improved oscillator which overcomes the detrimental effect of crystal holder shunt capacity at very-high-frequencies by utilizing such capacity in a manner that requires its presence in the circuit configuration.

A further object of this invention is to provide a new and improved crystal controlled very-high-frequency oscillator which operates on a crystal plug-in basis over a wide frequency band with simple retuning.

Still another object of this invention is to provide a new and improved crystal controlled high frequency oscillator which utilizes a simple method for balancing out the deviations in crystal holder capacity that occur from crystal to crystal.

A still further object of this invention is to provide a new and improved high-frequency crystal controlled oscillator which permits one terminal of the crystal unit to be grounded.

Numerous other objects, features and advantages of our invention will become apparent from consideration of the following description taken in conjunction with the accompanying drawing.

The single figure of the drawing is a schematic diagram of an oscillator according to our invention.

Referring now more particularly to the drawing, the broad circuit configuration of the present invention is a cathode coupled or differential amplifier having a split-load triode 8 and a grounded-grid amplifier triode 9. The plate 10 of triode 8 is connected to B+ supply through variable inductor 11 and choke coil 12, the latter forming part of a conventional line filter which includes capacitor 14 across the line. Shunting triode 8 is the conventional high-frequency crystal 16 which is connected in series with the D.C blocking capacitor 18 between the plate 10 of triode 8 and ground. Inherent crystal holder capacity, represented in dotted lines as $C_0$, is shown as shunting the crystal. To provide for substitution of crystals having other vlaues of $C_0$, a variable capacitor 20 is connected in parallel with the crystal, so that the sum of the values of $C_0$ and capacitor 20 may be preset to a desired value.

The triodes 8 and 9 are coupled through their cathodes 21 and 22, respectively, which are each connected to ground through common cathode resistor 23 to ground is the frequency compensating circuit of variable inductor 25 and capacitor 26 which resonate out stray capacitance such as the filament-to-cathode capacitance of the triodes. The grid 28 of triode 9 is connected directly to ground so as to effect a grounded-grid amplifier configuration for that triode. Plate 30 of triode 9 is connected to B+ supply through variable inductor 31 and choke coil 12. Inductors 11 and 31 are of equal value and ganged so as to effect simultaneous tuning, but it is to be noted that in very-high-frequency embodiments of the invention, these inductors may take the form of variable transmission lines. Shunting triode 9 to ground are series connected capacitors 33 and 34, with capacitor 33 chosen equal to a mean value of crystal holder capacitance $C_0$, and capacitor 34 chosen to balance out blocking capacitor 18, as well as to permit symmetry in the physical layout of the circuit. It will be recognized, however, that for low frequency operation such duplication as well as various other construction techniques utilized in VHF work, like the provision of the inductor 25 and capacitor 26, would be unnecessary, as is well understood by those skilled in the art. Providing for positive feedback between the amplifiers 8 and 9 is capacitor 36 which connects the plate 30 of triode 9 with the grid 37 of triode 8, the latter being connected to ground through grid resistor 38.

In considering the operation of the foregoing circuit, if the oscillation loop gain is greater than unity and proper phase relationships are maintained, oscillations will take place, as is well understood by those skiled in the art. Since the values of inductors 11 and 31 are equal, and the value of capacitor 33 is equal to $C_0$ plus the value of capacitor 20, these two circuits provide at their anti-resonant frequency, high plate impedance loads on the order of 2000 ohms for the respective triodes 8 and 9. It is important to note that a high impedance load is necessary for the proper operation of grounded-grid stage 9 so as to maintain optimum cathode-to-plate gain in the oscillation loop circuit. In triode 8, however, only the grid-to-cathode path is in the oscillation loop circuit. It has been found that by varying the plate load impedance of triode 8, the gain of such grid-to-cathode path is readily controllable, to the effect that such reduction in plate load impedance as would transform voltage amplifier triode 8 into a cathode follower configuration causes an increase in available grid-to-cathode gain therein, thereby increasing the overall oscillation loop gain to above unity. It can be seen then, that grid-to-plate gain in triode 8 has no direct effect on the oscillation loop gain since only the grid-to-cathode path thereof is in the oscillation loop circuit. Such decrease in plate impedance is accomplished where inductors 11 and 31 are tuned to one of the resonance overtones of crystal 16, in which case the shunting action of the low resonance resistance of the crystal degenerates the high plate impedance of triode 8 by appearing to triode 8 as electrically in parallel with variable inductor 11, thereby increasing the grid-cathode gain in the oscillator loop to above unity so as to support oscillations at an overtone mode of the fundamental frequency.

The frequency band covered by the oscillator is a function of the variable inductances 11 and 31 and the capacitances $C_0$ and 34. Since the crystal holder capacitance $C_0$ varies from crystal to crystal the tuning range can be fixed by adding the variable capacitor 20 across the crystal, so that $C_0$ plus capacitor 20 can always be set equal to a fixed value of capacitor 34, thereby maintaining a balanced load arrangement for the triodes 8 and 9.

A mathematical analysis of the oscillator action in the very-high-frequency range of 100 to 300 megacycles is not practical due to the difficulty in adequately describing and including the action of interelectrode and stray capacitances as well as transit time effects. A low frequency analysis, however, indicates the oscillation loop gain to be approximately 10 for a condition where the plate circuits are tuned to crystal resonance and a gain of 5 for a condition where the plate circuits are detuned. Since, in actuality, the loop gain for a condition of non-oscillation must be less than unity, it is theorized that negative feedback through stray reactance paths is accountable for shifting the net oscillator loop gains to the proper range wherein oscillations are supported only at the overtone modes of the fundamental crystal resonant frequency.

In practicing our invention, consistent operation has been obtained with the circuit shown, using a considerable number of crystal units at frequencies up to and including 325 megacycles per second. For the most part, these crystals had fundamental frequencies of 20 to 30 megacycles and where operated in their 11th and 13th overtone modes. In a model constructed for operation over the range of approximately 260 to 330 megacycles, no adjustment was necessary other than the initial setting of capacitor 20 for each crystal to balance the sum of the values of $C_0$ and capacitor 20 with the value of fixed capacitor 34. Similar properties were exhibited in models constructed for operation in the150–220 and 200–300 megacycle ranges.

From the foregoing it will be apparent that we have provided a new and improved very-high-frequency oscillator which is well adapted to fulfill the aforestated objects of the invention. Moreover, whereas the invention has been disclosed in particularity with reference to one embodiment which gives satisfactory results it will be understood by those skilled in the art to which the invention most nearly appertains, that additional embodiments and modifications thereof may be provided without departing from the spirit or scope of the invention as defined by the appended claims.

We claim:

1. In an oscillator, an amplifier tube having a cathode, grid and plate, means for forming an oscillation loop including the grid-to-cathode path of said amplifier tube, a source of plate bias having first and second potential terminals of a predetermined potential difference and a plate load circuit comprising a load impedance connected between said plate and said first potential terminal and a crystal controlled impedance connected between said plate and said second potential terminal, said load impedance being tuned to the resonant frequency of said crystal controlled impedance, whereby at said resonant frequency, the crystal controlled impedance shunts said load impedauce and reduces the value thereof, thereby causing an increase in the gain in said grid-to-cathode path of said amplifier tube.

2. The invention defined in claim 1, wherein said crystal controlled impedance comprises a crystal having an inherent shunt capacitance and a selectively variable capacitance connected in parallel therewith across said crystal to selectively adjust the resonant frequency of said crystal controlled impedance.

3. The invention defined in claim 1, wherein said load impedance comprises a variable inductance and said crystal controlled impedance comprises a coupling capacitor connected to said plate on one side thereof and a crystal having an inherent shunt capacitance and a selectively variable capacitance connected in parallel therewith across said crystal connected between the other side of said coupling capacitor and said second potential terminal, said variable inductance being tuned to anti-resonance with respect to the capacitance portion of said crystal controlled impedance as well as series-resonance with the entire crystal controlled impedance.

4. In an oscillator, means for forming an oscillation loop comprising first and second amplifier tubes each including a grid, cathode and plate, said first tube having the grid-to-cathode path thereof in said loop and being connected as a cathode follower, said second tube being connected as a grounded grid amplifier and having its plate-to-cathode path in said loop, a source of plate bias having first and second potential terminals of a predetermined potential difference, and means for providing an increase in the gain in said grid-to-cathode path of said first tube at a predetermined frequency without affecting the gain in said second tube to thereby increase the gain in said loop to a value which will sustain oscillations at said predetermined frequency, said means comprising first and second plate load circuits for said first and second amplifier tubes, respectively, said first load circuit comprising a first tuned load impedance connected between the plate of said first tube and said first potential terminal and a crystal controlled impedance connected between said plate of said first tube and said second potential terminal, and said second load circuit includes a second tuned load impedance connected between the plate of said second tube and said first potential terminal, both of said load impedances being tuned to the resonant frequency of said crystal controlled impedance, whereby at said resonant frequency, the crystal controlled impedance shunts said first load impedance and reduces the value thereof without affecting the second load impedance, thereby causing an increase in the gain in said grid-to-cathode path of said first tube and said oscillation loop.

5. The invention defined in claim 4, wherein said crystal controlled impedance comprises a crystal having an inherent shunt capacitance and a selectively variable capacitance connected in parallel therewith across said crystal to selectively adjust the resonant frequency of the said crystal controlled impedance.

6. The invention defined in claim 4, wherein said first load impedance and said second load impedance each comprise a variable inductance, said first and second load impedances being gang tuned, and wherein said second plate load circuit further includes a capacitive impedance between the plate of said second tube and said second potential terminal, said capacitive impedance being of a value such that said second tuned load impedance is anti-resonant therewith at the said predetermined frequency to thereby provide a maximum plate load impedance for said second amplifier tube.

7. The invention defined in claim 4 wherein said first and second load impedances each comprise a variable inductance, and said second plate load circuit further includes a capacitive impedance between the plate of said second tube and said second potential terminal and wherein said crystal controlled impedance comprises a coupling capacitor connected to the plate of said first tube on one side thereof and a crystal having an inherent shunt capacitance and a selectively variable capacitance connected in parallel therewith across said crystal connected between the other side of said coupling capacitor and said second potential terminal, said first load impedance being tuned to anti-resonance with respect to the capacitance portion of said crystal controlled impedance as well as series-resonance with the entire crystal controlled impedance, and said second load impedance being tuned to anti-resonance with said capacitive impedance in said second plate load circuit.

References Cited in the file of this patent

UNITED STATES PATENTS

| | | |
|---|---|---|
| 2,455,824 | Tellier et al. | Dec. 7, 1948 |
| 2,613,320 | Panetta | Oct. 7, 1952 |
| 2,718,593 | Felix | Sept. 20, 1955 |
| 2,740,891 | Bowser | Apr. 3, 1956 |
| 2,742,573 | Seeley | Apr. 17, 1956 |
| 2,805,400 | Seddon | Sept. 3, 1957 |
| 2,816,227 | Hahnel | Dec. 10, 1957 |

FOREIGN PATENTS

| | | |
|---|---|---|
| 687,748 | Great Britain | Feb. 18, 1953 |